United States Patent [19]
Liu et al.

[11] Patent Number: 6,023,635
[45] Date of Patent: Feb. 8, 2000

[54] PARALLEL INTERACTIVE SLICING MIP PROJECTION FOR MAGNETIC RESONANCE IMAGING

[75] Inventors: Kecheng Liu, Richmond Heights, Ohio; Jukka I. Tanttu, Espoo, Finland

[73] Assignee: Picker International, Inc., Highland Heights, Ohio

[21] Appl. No.: 08/915,622

[22] Filed: Aug. 21, 1997

[51] Int. Cl.[7] .................................................. A61B 5/055
[52] U.S. Cl. ......................... 600/410; 324/307; 324/309
[58] Field of Search ................................... 600/410, 419, 600/420; 324/307, 309

[56] References Cited

U.S. PATENT DOCUMENTS 5,167,232  12/1992  Parker et al. ......................... 128/653.3
5,560,360  10/1996  Filler et al. .............................. 600/410
5,926,021   7/1999  Hennig .................................... 324/306

OTHER PUBLICATIONS

"MR Angiography with Two–Dimensional Acquisition and Three–Dimensional Display", Keller, et al. Radiology 1989; 173–527–532.

Systematic Assessment of Sliding Interleaved $k_y$ 3D Acquisition (Slinky) Liu, et al., 5th ISMRM, p. 1841, Apr. 1997.
"Sliding Interleaved $k^y$ (Slinky) 3D Acquisition in Clinical Diagnosis: Intracranial Vessels and Left Internal Cartoid Aneurysm", Liu, et al. 5th ISMRM, p. 558, 1997.

Primary Examiner—Brian L. Casler
Attorney, Agent, or Firm—Fay, Sharpe, Fagan, Minnich & McKee, LLP

[57] ABSTRACT

A three dimensional magnetic resonance imaging technique is utilized to generate 1/Nth of a complete data set from a first selected slab (38a). The data set is complete in a read direction and a first phase encode direction and 1/Nth complete in a second phase encode direction. The selected slab is shifted by 1/Nth its dimension in the second phase encode direction and another 1/Nth complete data set is generated. This process is repeated until N data sets are generated. The N data sets are reconstructed into a slice image which slice images are stacked in a three dimensional final image memory (94) and which are projected (96) along a selected projection direction into a projection image (40). The process is repeated with each new data set replacing the oldest data set in memories (84$_1$, 84$_2$ . . .) to generate a stack of slice images which are projected into the projection image. At any time during the process, projection direction can be changed and the sliced data reprojected.

17 Claims, 4 Drawing Sheets

PARALLEL INTERACTIVE SLICING MIP PROJECTION FOR MAGNETIC RESONANCE IMAGING

BACKGROUND OF THE INVENTION

The present invention relates to the art of magnetic resonance imaging. It finds particular application in conjunction with Magnetic Resonance Angiography (MRA) and will be described with particular reference thereto. However, it should be appreciated that the present invention may also find application in conjunction with magnetic resonance spectroscopy, and other medical and diagnostic techniques, and the like.

Maximum Intensity Processing (MIP) is a common and powerful tool in clinical angiograms in connection with computer tomography (CT) and magnetic resonance imaging (MRI). Projection images are especially useful for screening vascular morphology and pathological diseases, such as stenosis, atherosclerosis and aneurysm. In clinical diagnosis, radiologists preferably view projection images rather than MRI slice images.

A MIP image is essentially a projection of a three-dimensional (3D) volume from a designated viewing point. The brightest pixel along each specified path from the view is picked to form the projection image. MIP images can be acquired from different viewing points, providing radiologists with flexibility to study cases. In MIP processing, the user also defines an area of interest. The tissues outside this area are excluded in the MIP process and therefore do not contribute to the finally formed MIP images. This improves the quality of the projection images. Because all the imaging data is always available, the user may also change the definition of the area of interest, if desired.

Currently, on most of the conventional MRI scanners, MRA MIP images are created after all axial (original) images are acquired. That is, only after the whole imaging process is completely accomplished, can the MIP process be initiated.

Commonly, the scanning process and MIP process are performed sequentially. It takes approximately 7–15 minutes to acquire image data during the initial data acquisition or scanning step. The MIP processing is performed after all of the image data has been acquired. Thus, from the start of scanning, approximately 15–20 minutes elapse before a radiologist can view the MRA MIP images and render a diagnosis. If the resulting MIP images are not of sufficient quality to permit a diagnosis due to, e.g. improper scanning parameters or incorrect volume coverage etc., an additional 15–20 minutes must be expended in order to repeat the process.

Most MRI vendors provide a feature for MRA, which displays the acquired axial (original) images while scanning is still being performed. This provides some information but is rather limited since MIP images are different than axial images, and there is no explicit information to indicate the relative position of axial images relative to the MIP images. Further, in the case where poor quality images, incorrect positioning or unnecessary images (slices) are generated, the data acquisition step can not be interrupted in order to start a new imaging step. Thus, the only option available is to complete the present data acquisition phase and then repeat the entire scan procedure with modified parameters.

In most cases, radiologists can not determine the exact volume coverage to be imaged before hand. Thus, an oversampling strategy is usually used to collect more slices which slices may not be necessary for the diagnosis. Collection of additional and/or unnecessary slices prolongs the imaging time, and results in decreased clinical diagnostic throughput.

The present invention contemplates a new and improved Magnetic Resonance Angiography (MRA) screening technique which overcomes the above-referenced problems and others.

SUMMARY OF THE INVENTION

In accordance with one aspect of the present invention, a magnetic resonance imaging method is disclosed. The method includes generating a magnetic field in an examination region, inducting dipoles in the examination region to resonate generating radio frequency resonance signals, applying at least slab select, phase encode, and read magnetic field gradients along orthogonal directions across the examination region. The method further includes a) exciting the resonance in a first selected slab in the examination region, b) inducing resonance and applying magnetic field gradients of a three dimensional magnetic resonance imaging sequence until 1/Nth of a set of volume data is acquired, where N is an integer, c) repeating steps (a) and (b) with the slab shifted by 1/Nth of a slab dimension, d) repeating steps (a)–(c) N times, e) reconstructing a slice image from the set of volume data, f) projecting the slice image as a line of a projection image, and g) repeating steps (a)–(f) to generate additional lines of the projection image.

In accordance with another aspect of the present invention, a magnetic resonance imaging method is disclosed. The method includes producing magnetic flux in an examination region, inducing dipoles in the examination region to resonance generating radio frequency resonance signals, generating at least phase and read magnetic field gradient pulses in orthogonal directions across the examination region, receiving and demodulating the radio frequency magnetic resonance signals, and reconstructing image representations from the received and demodulated resonance signals, and further includes updating a projection image in a sliding interleaved $K_Y$ 3D acquisition mode at a rate substantially equal to a rate of growing a projection image in a contiguous 2D stack acquisition mode of a parallel interactive slicing projection technique, and displaying the updating projection image for use in clinical diagnosis.

In accordance with a third aspect of the present invention, a magnetic resonance imaging system is disclosed. The magnetic resonance imaging system includes means for generating a magnetic field in an examination region, a radio frequency pulse controller and transmitter for inducing dipoles in the examination region to resonance such that radio frequency resonance signals are generated, gradient magnetic field coils and a gradient magnetic field controller for generating at least phase and read magnetic field gradient pulses in orthogonal directions across the examination region, a receiver for receiving and demodulating the radio frequency magnetic resonance signals, and an image processor for reconstructing image representations. The image processor includes means for updating a projection image in a sliding interleaved $K_Y$ 3D acquisition mode at a rate substantially equal to a rate of growing a projection image in a contiguous 2D stack acquisition mode of a parallel interactive slicing projection technique, and means for displaying said updating projection image for use in clinical diagnosis.

A primary advantage of the present invention is to provide a magnetic resonance angiography (MRA) screening technique whereby a radiologist adaptively interacts with a MRA MIP imaging process to improve scanning time efficiency and clinical throughput.

Another advantage of the present invention is the provision of a parallel interactive slicing MIP (maximum intensity processing) technique for magnetic resonance imaging which is utilized in combination with a Sliding Interleaved $k_Y$ (SLINKY) 3D acquisition technique.

Still further advantages of the present invention will become apparent to those of ordinary skill in the art upon reading and understanding of following detailed description of the preferred embodiments.

BRIEF DESCRIPTION OF THE DRAWINGS

The invention may take form in various parts and arrangement of parts. The drawings are only for purposes of illustrating preferred embodiments and are not to be construed as limiting the invention.

DETAILED DESCRIPTION OF THE PREFERRED EMBODIMENT

Figure 1:
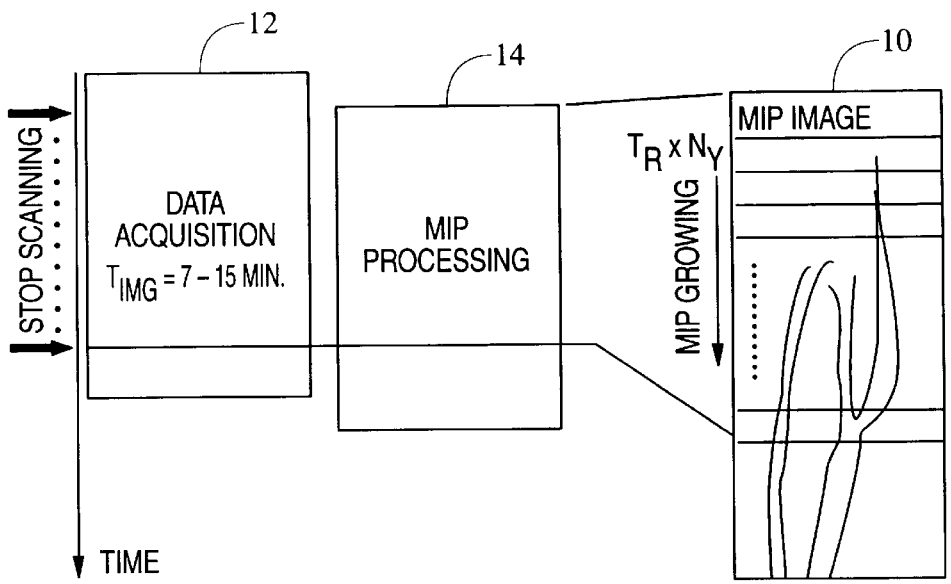
FIG. 1 is a diagrammatic illustration of a parallel, interactive slicing MRA process in accordance with the present invention.

Referring now to FIG. 1, a temporally building MIP image 10 is formed and displayed while the scanning is ongoing. The temporally building MIP image 10 permits a radiologist simultaneously to track if image quality is good enough for clinical diagnosis, if the prescribed positioning for volume coverage is correct, and if the anatomical morphology of interest is covered. In all cases mentioned above, the radiologist can stop the scanning either to restart or do image processing/analysis as soon as the interested volume coverage is achieved. In the latter case, the whole imaging process can be shortened to save scanner time, increase patient convenience, and increase throughput. Thus even though the radiologist could not accurately prescribe the scanning volume, this technique can still ensure a complete coverage without wasting unnecessary patient imaging time due to oversampling of more slices.

Each time a slice or slab is acquired and reconstructed 12, each reconstructed slice is projected 14 to generate the next line of the projection image 10. The update or growing rate of the temporary MIP image 10 depends on the imaging speed and acquisition fashion. In the case of a contiguous 2D stack acquisition mode (described further below), the data acquisition speed is approximately 5–10 seconds per slice, while in the case of a 3D multiple volumes/slabs acquisition mode, the imaging speed is around 60–90 seconds for 9–12 slices. Thus, the on-line MIP image 10 grows at a rate of 5–10 seconds per image line with 2D scanning, and 60–90 seconds per 9–12 image lines for 3D scanning.

Figure 2:
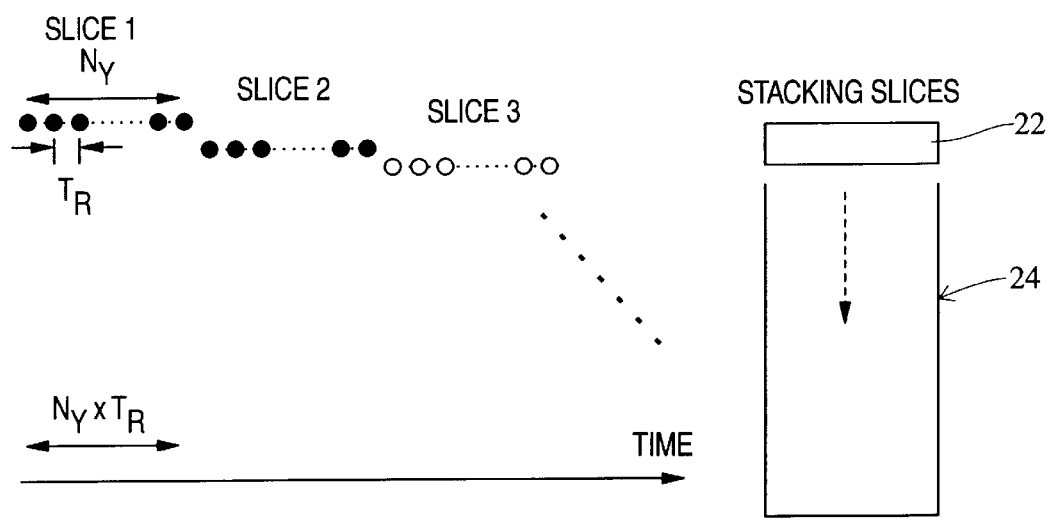
FIG. 2 is a diagrammatic illustration of a two-dimensional (2D) contiguous stack acquisition mode of the parallel interactive slicing MRA process.

With continuing reference to FIG. 1 and further reference to FIG. 2, a contiguous, 2D stack acquisition mode of the parallel interactive slicing MIP (maximum intensity processing) technique of the present invention is illustrated. In 2D acquisition, the MIP image 10 is formed from a group or a contiguous stack of 2D multi-slice images (axial) 22 which are generated in the data acquisition process 12 and then stored in a memory 24. The rate of growth of the MIP image is explicitly determined by the imaging time for one slice.

$$T_{imaging}=T_R \times N_Y$$

where $T_R$ is the repetition time, $N_Y$ is the total number of the phase encoding steps in the $k_Y$ axis. As soon as one slice acquisition is accomplished, that slice is projected such that the MIP image 10 grows by a step of one slice thickness. Typically, the imaging time is in the range of 5–8 seconds, depending on the scanning parameters of $T_R$ and $N_Y$. For example, a $T_R$=30 ms and $N_Y$=192 results in a $T_{imaging}$ of 5.76 seconds per slice.

Figure 3:
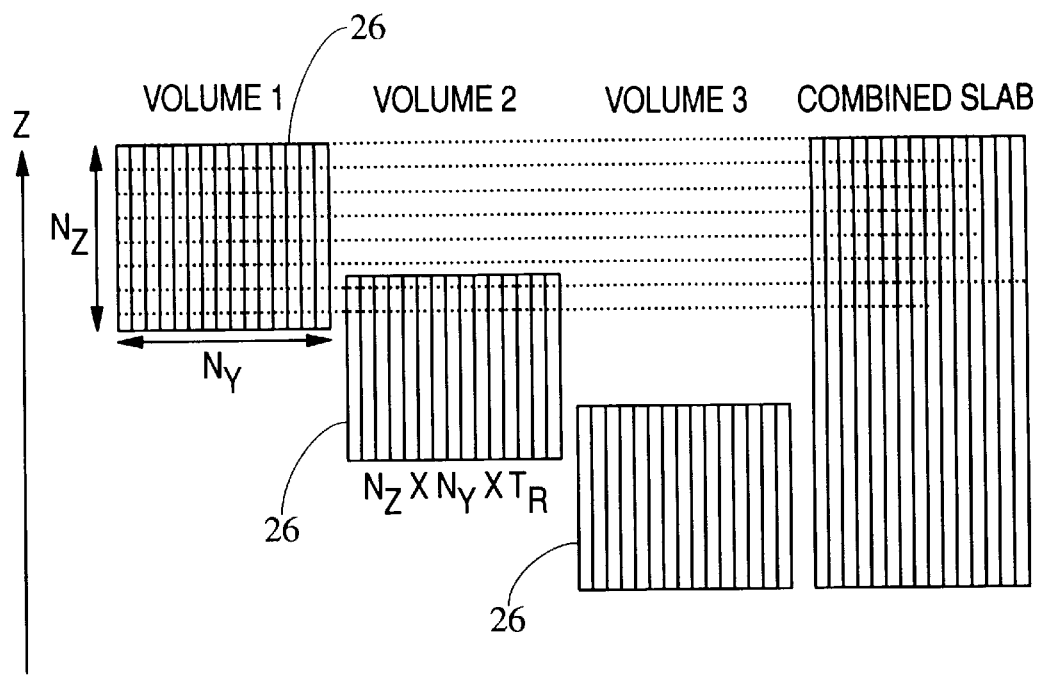
FIG. 3 is a diagrammatic illustration of a volume by volume data acquisition routine for a three-dimensional (3D) multi-volume acquisition mode of the parallel interactive slicing MRA process.
Figure 4:
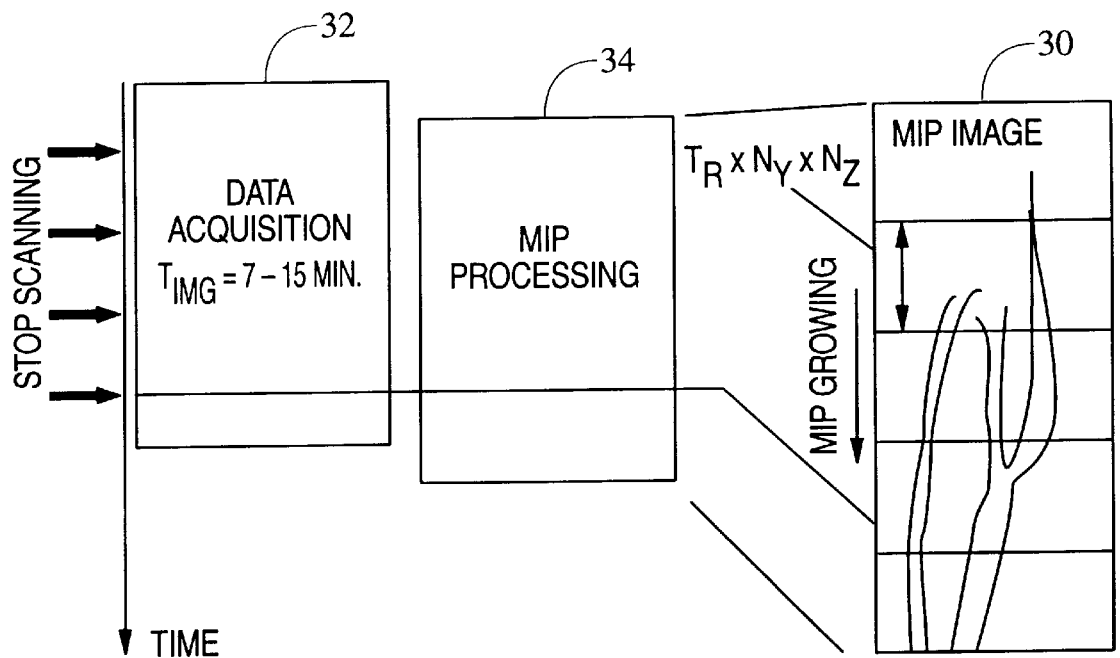
FIG. 4 a diagrammatic illustration of a stacking process for a MIP image in accordance with the (3D) multi-volume acquisition mode of FIG. 3.

With reference now to FIGS. 3 and 4, for a conventional 3D MRA with single slab acquisition, the parallel interactive slicing MIP (maximum intensity processing) technique of the present invention is not applicable. However, when using a multiple volume mode, the parallel interactive slicing MIP technique improves performance, particularly on the number of slices in each volume (slab) 26. With only few slabs the updating speed of the MIP images 30 is rather slow. The updating rate is mainly determined by the imaging time needed for collecting all phase encodings in one 3D volume (slab):

$$T_{imaging}=T_R \times N_Y \times N_Z$$

where $T_R$ is the repetition time, $N_Y$ and $N_Z$ are the total number of the phase encoding steps in the $k_Y$ axis and the $k_Z$ axis, respectively. Thus, for every $T_{imaging}$ interval (for a $T_R$=30 ms, $N_Y$=192 and $N_Z$=16, then $T_{imaging}$=92 seconds or approximately 1.5 minutes), and the MIP image 30 will increase by a step of ($N_Z$-$N_B$) times slice thickness of which $N_Z$ is the total slices in a volume 26, and $N_B$ is the blanked slices at the edge of volume 26 due to, e.g. RF imperfection. In comparison with the contiguous, 2D stack acquisition mode, MIP image growth rate is much slower and not continuous. This is simply because prior to the image reconstruction step, all data (phase encodings) in a volume must be collected in the memory.

More specifically, in a data acquisition and a reconstruction process 32, resonance is excited in a first volume or slab and the data collected to collect the data lines of a first of the volumes 26. The very edge data lines, e.g. the edge 5%, are discarded. If the volumes are to be overlapped 10%, then a projection processor 34 projects the first 90% of the slices of the first volume to form the first several data lines of the projection image 30. The data acquisition and reconstruction processor 32 then generates a second of the volumes 26. The edge 5% of the slices are discarded. The next, the last 10% of the slices from the first volume are averaged with the first 10% of the slices of the second volume to provide a smooth transition or interface as the first and second volumes are combined into the combined image 30. The projection processor 34 projects the slices in the averaged portion of the first and second slabs are projected sequentially into the MIP image, as are each of the remaining slices down to the last 10% of the volume or slab which will be averaged with the next slab before being projected. This process is repeated repetitively for each slab. When a large number of small slabs are generated, the MIP image grows regularly. When a small number of large slabs are imaged, the MIP grows irregularly in large chunks. It is further to be appreciated that the slabs need not be taken in order. When the slabs are taken non-consecutively, e.g. odd numbered slabs followed by even numbered slabs, the MIP image grows in a mosaic-like pattern.

Figure 5:
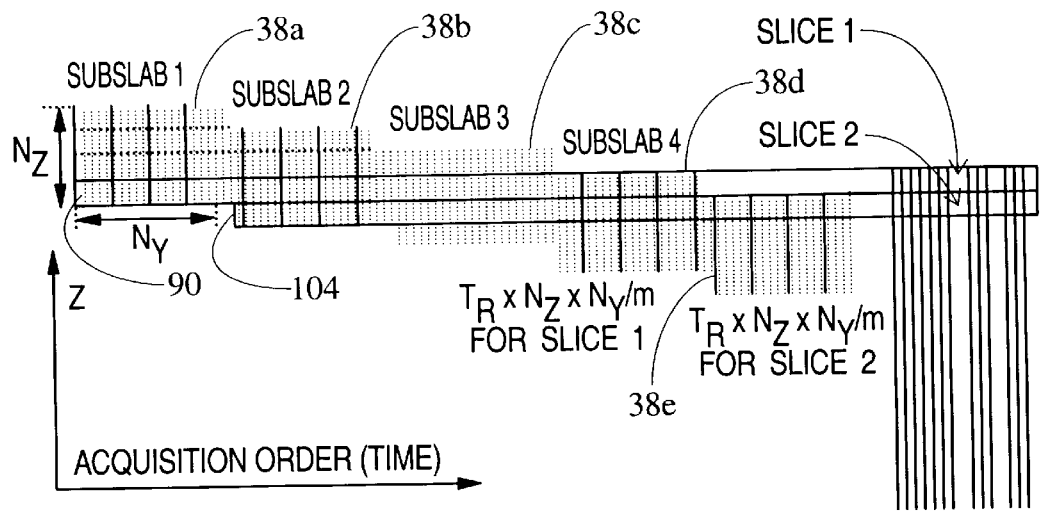
FIG. 5 is a diagrammatic illustration of a sub-volume by sub-volume data acquisition routine for a SLINKY (Sliding Interleaved $K_Y$) three-dimensional (3D) acquisition mode of the parallel interactive slicing MRA process.
Figure 6:
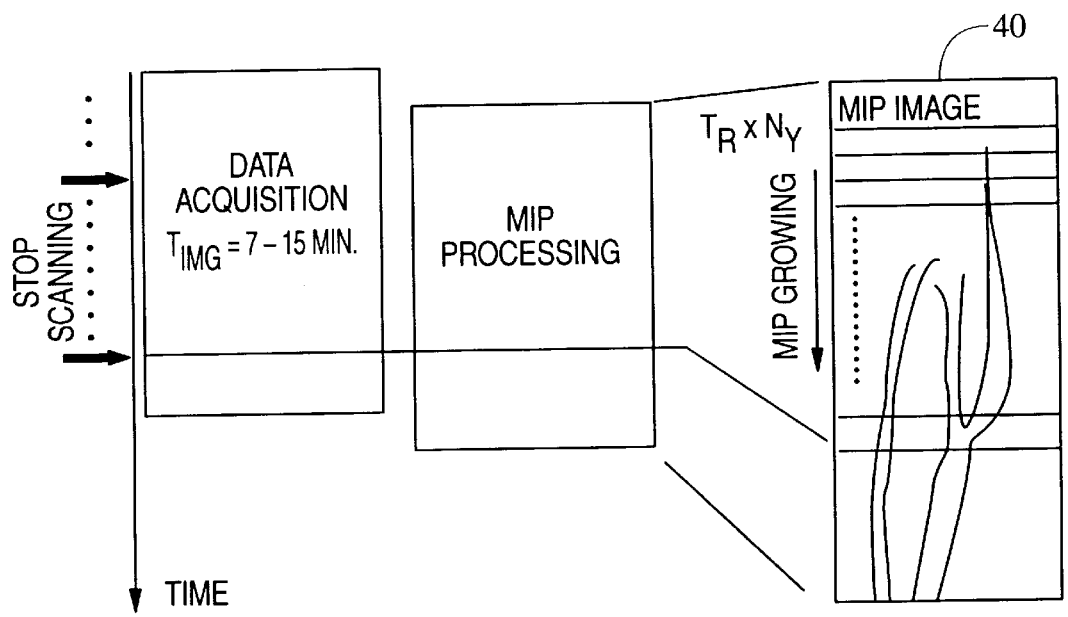
FIG. 6 a diagrammatic illustration of a stacking process for a MIP image in accordance with the SLINKY (3D) multi-volume acquisition mode of the parallel, interactive slicing MRA process of FIG. 5.

With reference now to FIGS. 5 and 6, a SLiding INterleaved $K_Y$ (SLINKY) 3D Acquisition mode of the parallel interactive slicing MIP (maximum intensity processing) technique of the present invention is shown. In the SLINKY acquisition mode, a 3D sub-volume (interleaf) 38a–38e continuously "walks" along the slab direction (z-axis), resulting in a virtually 2D acquisition imaging speed as FIG. 5 shows. In one of the typical SLINKY acquisition fashions, a sub-volume means that only designated partial set of $k_Y$ lines but full $k_Z$ lines are collected instead of full $k_Y$ and $k_Z$ lines in comparison with the case of the 3D acquisition as shown in FIG. 3.

FIG. 5 illustrates a case where the total $k_Y$ encodings are divided into 4 groups (interleaves). After the first three groups (subslab 1 to subslab 3), acquisition of every additional group (sub-volume) completes a sampling of $k_Y$ lines for one slice, completing a data set for reconstruction into a slice image and projection of the slice as one line of the MIP image. The rate of growth of the MIP image 40 is therefore equal to the imaging time needed for collecting partial $k_Y$ lines (e.g. 25% $N_Y$ in FIG. 5) but full $k_Z$ lines in a subslab. The total imaging time for a subslab or interleaf is given by:

$$T_{imaging} = T_R \times (N_Y/N_Z - N_B) \times N_Z \approx T_R \times N_Y$$

where $T_R$ is the repetition time, $N_Y$ and $N_Z$ are the total number of phase encoding steps in $k_Y$ and $k_Z$ axis, and $N_B$ is the number of blanked slices per slab as illustrated in FIG. 9, respectfully. For example, a typical setting of $T_R$=30 ms, $N_Y$=192, $N_Z$=16 and $N_B$=4 results in a $T_{imaging}$ of 7.68 seconds per slice. Compared with the multi-volume 3D acquisition mode of FIGS. 3 and 4, the SLINKY 3D acquisition mode updates the MIP image more continuously, and the growth rate is much faster, (i.e. being comparable with that of 2D acquisition mode of FIGS. 1 and 2).

Figure 7:
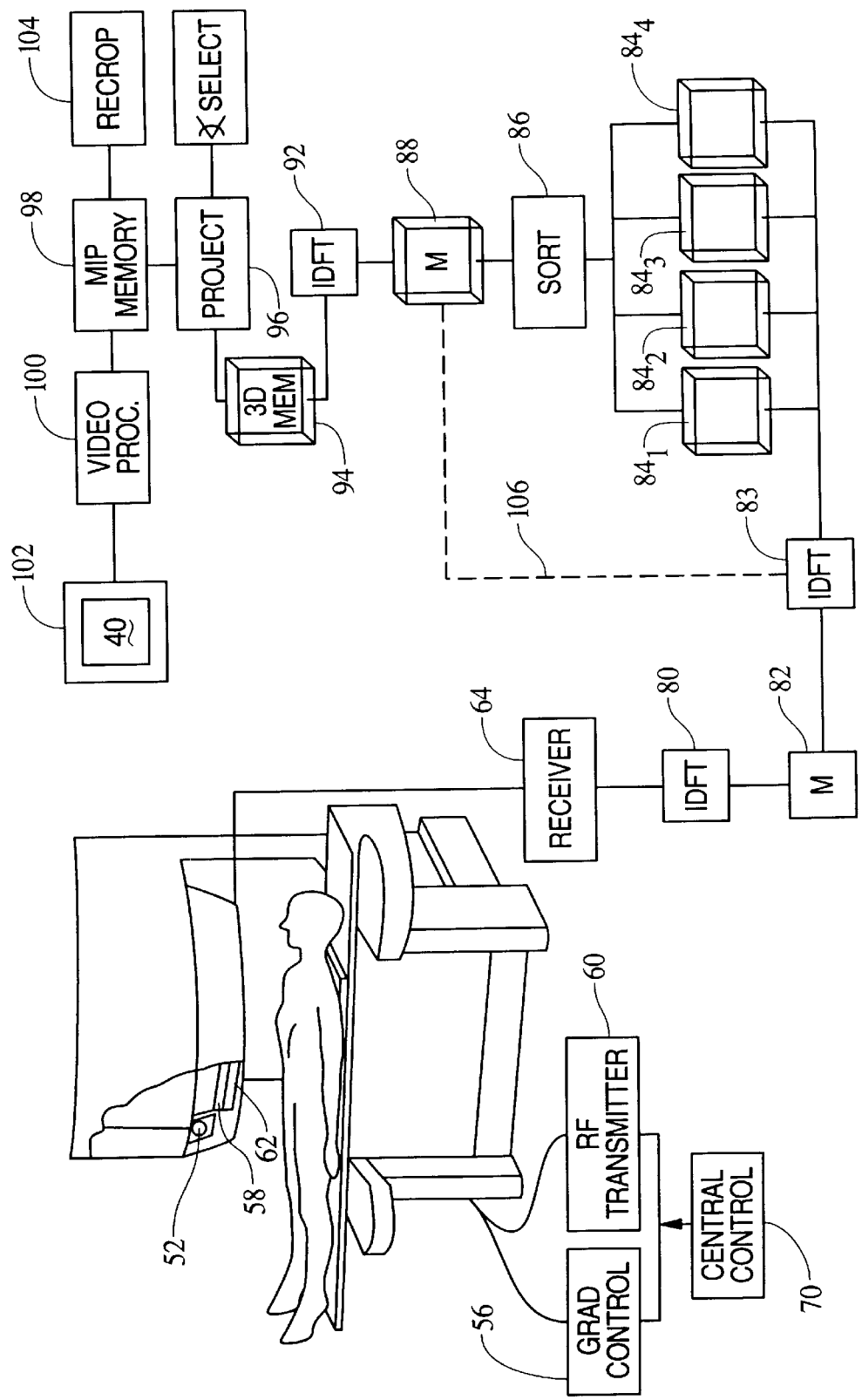
FIG. 7 is a diagrammatic illustration of a magnetic resonance imaging system for performing the method of FIGS. 5 and 6.

With reference to FIG. 7, a main magnetic field control controls super conducting permanent or resistive magnets 52 such that a substantially uniform, temporally constant magnetic field is created along a Z-axis through an examination region 54. Gradient pulse amplifiers 56 apply current pulses to selected ones or pairs of whole body gradient coils 58 to create magnetic field gradients along X, Y, and Z-axis of the examination region. A radio frequency transmitter 60 is connected to a whole body radio frequency coil 62 to transmit RF pulses into the examination region. A second set of magnet coils, gradient coils and radio frequency coil are disposed below the patient as the lower pole piece. The whole body radio frequency coil or a surface coil array (not shown) is connected with a receiver 64 for demodulating the resultant resonance signals.

A sequence controller 70 controls the gradient amplifiers and the digital transmitter to generate the data described in FIG. 5. More specifically, the digital transmitter is caused to generate a radio frequency excitation pulse concurrently with a slab selection pulse which limits excitation to the slab 38a. The sequence control further controls the gradient amplifiers and the digital transmitter to generate a conventional 3D imaging sequence, except that only 1/Nth e.g. one-quarter of the phase encoded gradients along the slice select direction are generated.

Each received data line is one dimensionally inverse Fourier transformed 80 in a read direction and stored in a first memory 82. When a full set of transformed data lines are generated, a second one dimensional inverse Fourier transform 83 is performed in the phase encode direction on the data in memory 82 to generate partially reconstructed data which is stored in a three dimensional sub-image memory $84_1$.

Once the first sub-image memory is filled, the sequence controller starts generating the second subslab 38b. In particular, the slab select gradient is shifted along the slice select a predetermined amount, e.g. 1/Nth of the slab dimension along the slice select axis. For example, where N is 4, the slab select gradient is shifted one quarter (1/N) of the slab dimension. The process is then repeated to generate a second set of partial image data which is stored in a second sub-image memory $84_2$. The sequence controller then shifts the slab another 1/Nth e.g. one-quarter of the slab dimension to generate the partial image data from the third subslab 38c which is stored in a third sub-image memory $84_3$. The sequence controller again shifts the slab select along the slice select by one quarter of the slab dimension and generates the data from the fourth subslab 38d which is stored in fourth sub-image memory $84_4$. In the embodiment being described, the slab select gradient is shifted in order to generate the partial sets of data. However, it should be appreciated that the partial sets of data may be generated in other ways, such as by shifting the transmitter frequency, shifting the main magnetic field $B_O$, and/or a mechanically shifting either subject to be imaged or the imaging device.

A sort procedure 86 sorts the twice Fourier transformed partial data sets from the memories $84_1$, $84_2$, $84_3$, $84_4$ into a volume memory 88. As indicated in FIG. 5, the volume memory 88 has a full set of phase encoded data in the slice select and read directions for slice 90. A third one dimensional Fourier transform processor 92 performs a one dimensional Fourier transform on the data for slice 90 in the phase encode direction to generate a slice image which is stored in a final image memory 94. As soon as the slice is reconstructed, a projection processor 96 starts projecting the slice into a corresponding line of a projection memory 98. A video processor 100 converts the data in the projection memory 98 into appropriate format for display as the MIP image 40 on a video monitor 102. It is to be appreciated that the Fourier transform is the read direction can be performed at any point from first as illustrated to last after the phase encode direction Fourier transform.

A recrop processor 104 is used by the select a region of interest in an axial image from where a projection is calculated. The recrop processor 104 limits the region of the reconstructed slices which is projected. A user defines an area of interest in the first received image and the projection is performed accordingly. The user may also change the definition (e.g. the bounded area selected) if necessary, based on the later images, after which the data is reprojected.

As the sorter 86 removes the data from the first sub-image memory $84_1$, the sequence controller 70 shifts the slab select gradient by a quarter of the slab dimension and generates the next set of data for subslab 38e which is processed and stored in the first sub-image memory $84_1$. When the sorter 86 arranges the data from partial data memories $84_1$–$84_4$ into a three dimensional data memory 88, a full set of data is compiled for data along the slice 104 of FIG. 5. This data is one dimensionally Fourier transformed 92, stacked with the other reconstructed slices in the final image memory 94, and projected 96 to form the next line of the MIP image 40. This process continues with each shifting of the slab select gradient by one quarter of the slab dimension resulting in the generation of one more line of the projection image 40.

When performing the conventional 2D and 3D projection techniques illustrated in FIGS. 2–4, the one dimensional inverse Fourier transform processor 80 may perform a one dimensional inverse Fourier transform in the read direction after the third one dimensional Fourier transform processor 92 performs a one dimensional Fourier transform on the data for slice 90 in the phase encode direction. Thus, the one dimensional inverse Fourier transform processor for the read direction may be positioned between the phase encode direction one dimensional Fourier transform processor 92 and the 3D memory 94 to generate a slice image which is stored in the final image memory 94.

It is to be appreciated that shifting by one quarter of the slab volume has been selected by way of illustration. Any other fractional shift of the slab volume 1/Nth can also be utilized, although fractions which are an even power of 2 are preferred. It is also to be appreciated that the present invention may be used with different types of magnetic resonance imaging devices which incorporate resistive C-magnets or superconducting toroidal magnets.

Further, with regard to the conventional 2D and 3D projection techniques of FIGS. 2–4, the sub-image memories $84_1$–$84_4$ and the sorter 86 are not utilized. Thus, each data line is one dimensionally inverse Fourier transformed in the read direction, the set of data lines are Fourier transformed in the phase encode direction, and are then stored in the memory 88 via a line 106 thus bypassing the sub-image memories $84_1$–$84_4$ and the sorter 86.

Alternative embodiments of the parallel interactive slicing maximum intensity processing technique of the present invention will be apparent to those skilled in the art. An obvious feature is that a radiologist can change the viewing point (projection angle) to form a new defined MIP image for monitoring. In addition, referring the intermediate MIP and axial images will lead to a more accurate clinical diagnosis. Further, the MIP image need not be built from the top down. Rather it can be built from the bottom up, the middle out, etc.

The invention has been described with reference to the preferred embodiments. Obviously, modifications and alterations will occur to others upon reading and understanding the preceding detailed description of the preferred embodiment. It is intended that the invention be construed as including all such alterations and modifications insofar as they come within the scope of the appended claims or the equivalents thereof.

For instance, although three discrete one-dimensional inverse Fourier transform processors are shown in FIG. 7, it should be appreciated that two- or three-dimensional inverse Fourier transforms may be performed using the appropriate techniques and hardware.

Having thus described the preferred embodiment, the invention is now claimed to be:

1. A magnetic resonance imaging method including generating a magnetic field in an examination region, inducting dipoles in the examination region to resonate generating radio frequency resonance signals, applying at least slab select, phase encode, and read magnetic field gradients along orthogonal directions across the examination region, and further including:

a) exciting the resonance in a first selected slab in the examination region;

b) inducing resonance and applying magnetic field gradients of a three dimensional magnetic resonance imaging sequence until 1/Nth of a set of volume data is acquired, where N is an integer;

c) repeating steps (a) and (b) with the slab shifted by 1/Nth of a slab dimension;

d) repeating steps (a)–(c) N times;

e) reconstructing a slice image from the set of volume data;

f) projecting the slice image as a line of a projection image;

g) repeating steps (a)–(f) to generate additional lines of the projection image.

2. The method as set forth in claim 1 wherein N is a plural integer.

3. The method as set forth in claim 1 wherein N equals 4.

4. The method as set forth in claim 1 wherein the data sets generated in step (b) are complete along a read axis and a first phase encode axis and are 1/Nth complete along a second phase encode axis, and in step (c), the slab in shifted along the second phase encode axis.

5. The method as set forth in claim 1 wherein the N most recent data sets are reconstructed in step (e).

6. The method as set forth in claim 1 further including selecting a new projection angle and reprojecting the reconstructed slices along the selected slice direction.

7. The method as set forth in claim 1 wherein N equals 1 and further including monitoring the projection image and selectively terminating the acquisition of data in response to the monitoring.

8. The method as set forth in claim 7 further including changing a selected projection angle and reprojecting the reconstructed slices along the selected projection angle.

9. The method as set forth in claim 1 further including:

defining and changing a selected region of interest from where the projection image is calculated; and reprojecting the reconstructed slices based on said selected region.

10. A magnetic resonance imaging method including producing magnetic flux in an examination region, inducing dipoles in the examination region to resonance generating radio frequency resonance signals, generating at least phase and read magnetic field gradient pulses in orthogonal directions across the examination region, receiving and demodulating the radio frequency magnetic resonance signals, and reconstructing image representations from the received and demodulated resonance signals, and further including:

updating a projection image in a sliding interleaved $K_Y$ 3D acquisition mode at a rate substantially equal to a rate of growing a projection image in a contiguous 2D stack acquisition mode of a parallel interactive slicing projection technique; and displaying said updating projection image for use in clinical diagnosis.

11. A magnetic resonance imaging system having means for generating a magnetic field in an examination region, a radio frequency pulse controller and transmitter for inducing dipoles in the examination region to resonance such that radio frequency resonance signals are generated, gradient magnetic field coils and a gradient magnetic field controller for generating at least phase and read magnetic field gradient pulses in orthogonal directions across the examination region, a receiver for receiving and demodulating the radio frequency magnetic resonance signals, and an image processor for reconstructing image representations, the image processor including:

means for updating a projection image in a sliding interleaved $K_y$ 3D acquisition mode at a rate substantially equal to a rate of growing a projection image in a contiguous 2D stack acquisition mode of a parallel interactive slicing projection technique; and means for displaying said updating projection image for use in clinical diagnosis.

12. The magnetic resonance imaging system of claim 11, further including:

means for exciting the resonance in a first selected slab in the examination region;

means for inducing resonance and applying magnetic field gradients of a three dimensional magnetic resonance imaging sequence until 1/Nth of a set of volume data is acquired, where N is an integer;

means for shifting a slab dimension by 1/Nth;

means for reconstructing a slice image from the set of volume data; and a projection processor for projecting the slice image as a line of a projection image.

13. The magnetic resonance imaging system of claim 11, further including:

a sequence controller for shifting a slab select gradient by 1/Nth of a slab dimension in a phase-encode direction to generate a plurality of partial sets of data;

first means for one-dimensionally inversely Fourier transforming each of the partial sets of data in a read direction;

a first memory for storing the inversely Fourier transformed partial sets of data.

14. The magnetic resonance imaging system of claim 13, further including:

second means for one-dimensionally inversely Fourier transforming a full set of phase encoded data in the complete phase encode direction to generate partially reconstructed data, a plurality of sub-memories for separately storing each of a plurality of the full sets of phase encoded data.

15. The magnetic resonance imaging system of claim 14, further including:

a sorter for arranging the sets of data stored in the plurality of sub-memories; and a three-dimensional memory for storing a full set of image data arranged by the sorter;

third means for one-dimensionally inversely Fourier transforming the full set of image data; and an image memory for storing the one-dimensionally inversely Fourier transformed data.

16. The magnetic resonance imaging system of claim 15, further including:

a projection processor for projecting the transformed data stored in the image memory as a line of a projection image.

17. The magnetic resonance imaging system of claim 15, further including:

a recrop processor having means for defining and changing a selected region of interest from where a projection image is calculated, and means for reprojecting reconstructed image slices based on said selected region of interest.

* * * * *